US012811345B2

(12) United States Patent
Huang et al.

(10) Patent No.: US 12,811,345 B2
(45) Date of Patent: Nov. 24, 2026

(54) CONNECTING ASSEMBLY AND ELECTRONIC APPARATUS THEREWITH

(71) Applicant: Moxa Inc., New Taipei City (TW)

(72) Inventors: Yi-Chun Huang, New Taipei City (TW); Ru-Fan Wei, New Taipei City (TW)

(73) Assignee: Moxa Inc., New Taipei City (TW)

( * ) Notice: Subject to any disclaimer, the term of this patent is extended or adjusted under 35 U.S.C. 154(b) by 368 days.

(21) Appl. No.: 18/780,445

(22) Filed: Jul. 22, 2024

(65) Prior Publication Data

US 2025/0087942 A1 Mar. 13, 2025

Related U.S. Application Data

(60) Provisional application No. 63/537,201, filed on Sep. 8, 2023.

(30) Foreign Application Priority Data

Mar. 15, 2024 (TW) ................................ 113109745

(51) Int. Cl.
*H01R 13/642* (2006.01)
*H01R 13/52* (2006.01)
(Continued)

(52) U.S. Cl.
CPC ......... *H01R 13/642* (2013.01); *H01R 13/521* (2013.01); *H01R 13/62927* (2013.01); *H05K 7/20409* (2013.01); *H01R 24/60* (2013.01)

(58) Field of Classification Search
CPC ................ H01R 13/642; H01R 13/521; H01R 13/62927; H01R 24/60; H05K 7/20409
See application file for complete search history.

(56) References Cited

U.S. PATENT DOCUMENTS

| | | | |
|---|---|---|---|
| 6,138,352 | A | 10/2000 | Smith |
| 2005/0215107 | A1 | 9/2005 | Castello |

(Continued)

FOREIGN PATENT DOCUMENTS

| | | | |
|---|---|---|---|
| CN | 203734021 | U | 7/2014 |
| CN | 111031736 | A | 4/2020 |

(Continued)

OTHER PUBLICATIONS

Machine translation of CN-119603900-A (Year: 2025).*

*Primary Examiner* — Leah Macchiarolo
(74) *Attorney, Agent, or Firm* — Winston Hsu

(57) ABSTRACT

A connecting assembly for providing an aligning connection between a first electronic device and a second electronic device includes a first connecting component disposed on the first electronic device, a plurality of first heat dissipating fins disposed on the first connecting component, a second connecting component disposed on the second electronic device, a plurality of second heat dissipating fins disposed on the second connecting component, and a pin. An engaging portion is formed on one of the first heat dissipating fins. A cooperating engaging portion is formed on one of the second heat dissipating fins. The pin protrudes from the first connecting component and for being inserted into the second connecting component. The engaging portion is for abutting against the cooperating engaging portion along a direction perpendicular to an inserting direction of the pin. Besides, a related electronic apparatus is also provided.

20 Claims, 14 Drawing Sheets

(51) Int. Cl.

| | |
|---|---|
| ***H01R 13/629*** | (2006.01) |
| ***H05K 7/20*** | (2006.01) |
| *H01R 24/60* | (2011.01) |

(56) References Cited

U.S. PATENT DOCUMENTS

| | | | | |
|---|---|---|---|---|
| 2009/0165997 | A1 | 7/2009 | Ma | |
| 2019/0067921 | A1 * | 2/2019 | Nagano | H02G 3/03 |
| 2021/0100123 | A1 | 4/2021 | Dallaserra | |

FOREIGN PATENT DOCUMENTS

| | | | | |
|---|---|---|---|---|
| CN | 111757616 | A | 10/2020 | |
| CN | 115915717 | A | 4/2023 | |
| CN | 119603900 | A * | 3/2025 | H05K 5/06 |
| EP | 2 672 361 | A2 | 7/2012 | |
| JP | 2004-158757 | A | 6/2004 | |
| JP | 2017-228748 | A | 12/2017 | |
| JP | 2019-46849 | A | 3/2019 | |
| TW | I812169 | B | 8/2023 | |

* cited by examiner

CONNECTING ASSEMBLY AND ELECTRONIC APPARATUS THEREWITH

CROSS REFERENCE TO RELATED APPLICATIONS

This application claims the benefit of U.S. Provisional Application No. 63/537,201, filed on Sep. 8, 2023. The content of the application is incorporated herein by reference.

BACKGROUND OF THE INVENTION

1. Field of the Invention

The present invention relates to a connecting assembly and an electronic apparatus therewith, and more specifically, to a connecting assembly for providing an aligning connection between a first electronic device and a second electronic device tightly and firmly, and an electronic apparatus therewith.

2. Description of the Prior Art

In order to satisfy different demands in different fields, modularity has gradually become a mainstream trend of electronic apparatuses. The electronic apparatus usually includes multiple detachable devices structurally and electrically connected to each other. For example, the detachable device can be a power supply device, a signal switch device, or a computing device. Therefore, it is an important topic in the field to provide a tight and firm aligning connection between the two detachable devices for improving a reliability of the electronic apparatus.

SUMMARY OF THE INVENTION

It is an objective of the present invention to provide a connecting assembly for providing an aligning connection between a first electronic device and a second electronic device tightly and firmly, and an electronic apparatus therewith.

In order to achieve the aforementioned objective, the present invention discloses a connecting assembly for aligning and connecting a first electronic device and a second electronic device. The connecting assembly includes a first connecting component, a plurality of first heat dissipating fins, a second connecting component, a plurality of second heat dissipating fins, and a pin protruding. The first connecting component is disposed on the first electronic device. The plurality of first heat dissipating fins are disposed on the first connecting component. An engaging portion is formed on at least one of the plurality of first heat dissipating fins. The second connecting component is disposed on the second electronic device. The plurality of second heat dissipating fins are disposed on the second connecting component. A cooperating engaging portion is formed on at least one of the plurality of second heat dissipating fins. The pin protrudes from the first connecting component and configured to be inserted into the second connecting component along a first direction. When the pin is inserted into the second connecting component along the first direction, the plurality of first heat dissipating fins are configured to respectively be aligned with and abut against the plurality of second heat dissipating fins along the first direction, and the engaging portion is configured to engage with the cooperating engaging portion along the first direction and abut against the cooperating engaging portion along a second direction and a third direction opposite to each other and perpendicular to the first direction.

According to an embodiment of the present invention, one and another one of the engaging portion and the cooperating engaging portion are an engaging protrusion and an engaging recess.

According to an embodiment of the present invention, a width of the engaging protrusion gradually decreases from a bottom of the engaging protrusion, and a width of the engaging recess gradually increases from a bottom of the engaging recess.

According to an embodiment of the present invention, a first engaging portion, a second engaging portion and a third engaging portion are respectively formed on a first one, a second one and a third one of the plurality of first heat dissipating fins. The second one of the plurality of first heat dissipating fins is located between the first one and the third one of the plurality of first heat dissipating fins along an arranging direction of the plurality of first heat dissipating fins. The second engaging portion and the first engaging portion are misaligned from each other along the arranging direction of the plurality of first heat dissipating fins. The second engaging portion and the third engaging portion are misaligned from each other along the arranging direction of the plurality of first heat dissipating fins. A first cooperating engaging portion, a second cooperating engaging portion and a third cooperating engaging portion are respectively formed on a first one, a second one and a third one of the plurality of second heat dissipating fins. The second one of the plurality of second heat dissipating fins is located between the first one and the third one of the plurality of second heat dissipating fins along an arranging direction of the plurality of second heat dissipating fins. The second engaging portion and the first engaging portion are misaligned from each other along the arranging direction of the plurality of second heat dissipating fins, and the second engaging portion and the third engaging portion are misaligned from each other along the arranging direction of the plurality of second heat dissipating fins.

According to an embodiment of the present invention, the connecting assembly further includes a resilient component and a locking component. The resilient component is disposed inside the second connecting component and configured to apply a radial resilient force onto the pin inserted into the second connecting component. The locking component is screwed onto the second connecting component and configured to apply a radial locking force onto the pin inserted into the second connecting component.

According to an embodiment of the present invention, the connecting assembly further includes an abutting component disposed inside the second connecting component and configured to abut against the pin. The resilient component abuts against the abutting component to indirectly apply the radial resilient force onto the pin via the abutting component.

According to an embodiment of the present invention, a groove is formed on an outer periphery of the pin along a circumferential direction of the pin and configured to cooperate with the abutting component and the locking component.

According to an embodiment of the present invention, the connecting assembly further includes a sealing component disposed between the first connecting component and the second connecting component, and when the locking component is screwed onto the second connecting component, a cooperation of the locking component and the groove drives the pin to move from an initial inserting position to a predetermined inserting position along the first direction for driving the first connecting component to move along the first direction together with the pin, such that the sealing component is clamped to be resiliently deformed by the first connecting component and the second connecting component.

According to an embodiment of the present invention, the abutting component is a ball-shaped structure or a protruding platform structure. The locking component is a screw or a bolt, and the resilient component is a compression spring.

According to an embodiment of the present invention, the connecting assembly further includes a sealing component disposed between the first connecting component and the second connecting component, and when the locking component is screwed onto the second connecting component, a cooperation of the locking component and the pin drives the pin to move from an initial inserting position to a predetermined inserting position along the first direction for driving the first connecting component to move along the first direction together with the pin, such that the sealing component is clamped to be resiliently deformed by the first connecting component and the second connecting component.

Besides, the present invention further discloses an electronic apparatus. The electronic apparatus includes a first electronic device, a second electronic device detachably connected to the first electronic device, and a connecting assembly for aligning and connecting the first electronic device and the second electronic device. The connecting assembly includes a first connecting component, a plurality of first heat dissipating fins, a second connecting component, a plurality of second heat dissipating fins, and a pin. The first connecting component is disposed on the first electronic device. The plurality of first heat dissipating fins are disposed on the first connecting component. An engaging portion is formed on at least one of the plurality of first heat dissipating fins. The second connecting component is disposed on the second electronic device. The plurality of second heat dissipating fins are disposed on the second connecting component. A cooperating engaging portion is formed on at least one of the plurality of second heat dissipating fins. The pin protrudes from the first connecting component and configured to be inserted into the second connecting component along a first direction. When the pin is inserted into the second connecting component along the first direction, the plurality of first heat dissipating fins are configured to respectively be aligned with and abut against the plurality of second heat dissipating fins along the first direction, and the engaging portion is configured to engage with the cooperating engaging portion along the first direction and abut against the cooperating engaging portion along a second direction and a third direction opposite to each other and perpendicular to the first direction.

In summary, in the present invention, a cooperation of the engaging portion and the cooperating engaging portion can provide support for the pin along a vertical direction relative to the pin for reducing a vertical shear force acting on the pin, so as to prevent the pin from being damaged or broken. Besides, the cooperation of the engaging portion and the cooperating engaging portion also can ensure the first electronic device and the second electronic device to be connected to each other and prevent the first electronic device or the second electronic device from being connected to another electronic device by mistake, so as to achieve a foolproof effect. From the above, the present invention has improved reliability in use.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as “top”, “bottom”, “left”, “right”, “front”, “back”, etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term “connect” is intended to mean either an indirect or direct electrical/mechanical connection. Thus, if a first device is connected to a second device, that connection may be through a direct electrical/mechanical connection, through an indirect or electrical/mechanical connection via other devices and connections.

Figure 1:
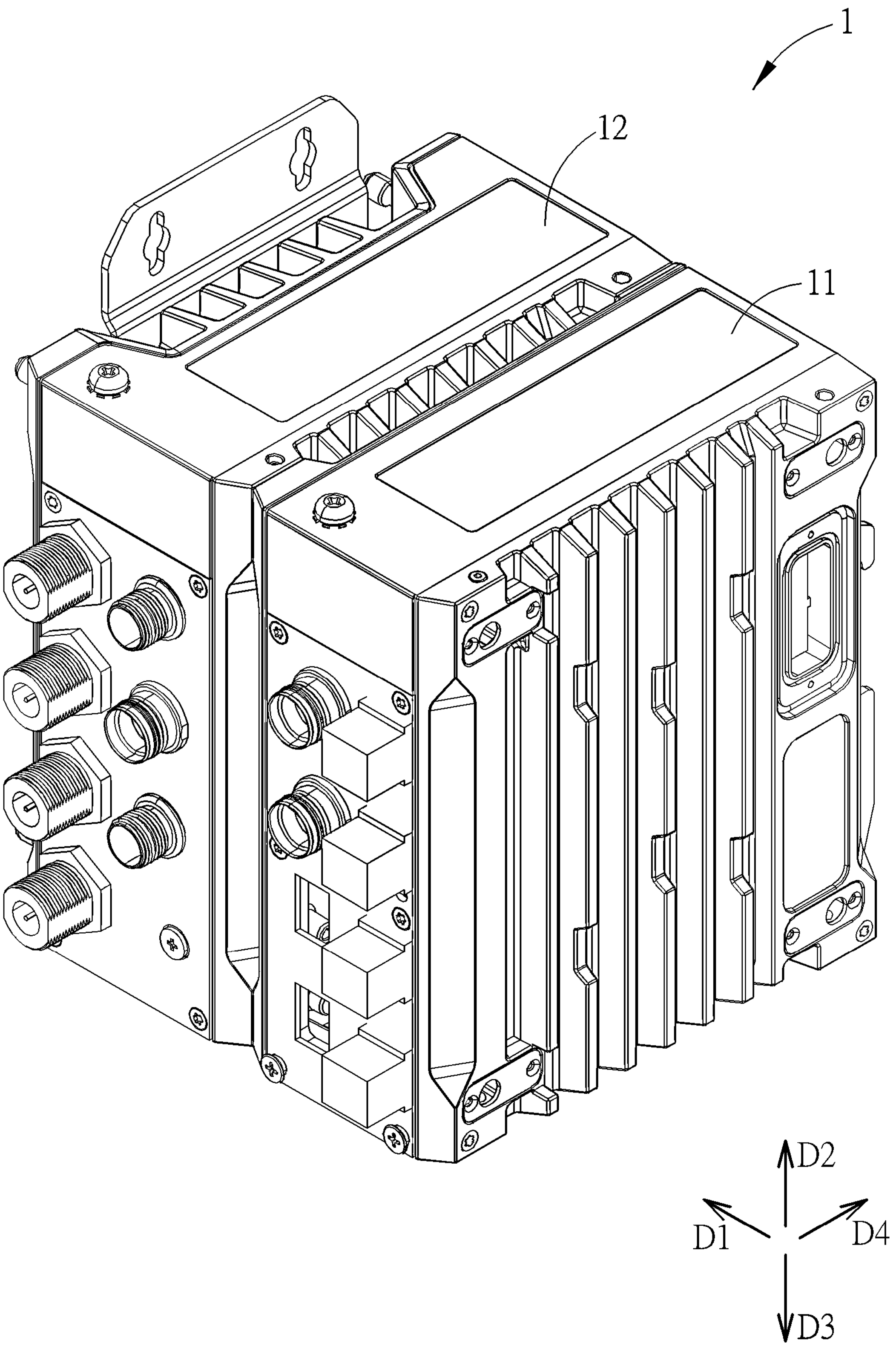
FIG. 1 is a schematic diagram of an electronic apparatus according to an embodiment of the present invention.
Figure 2:
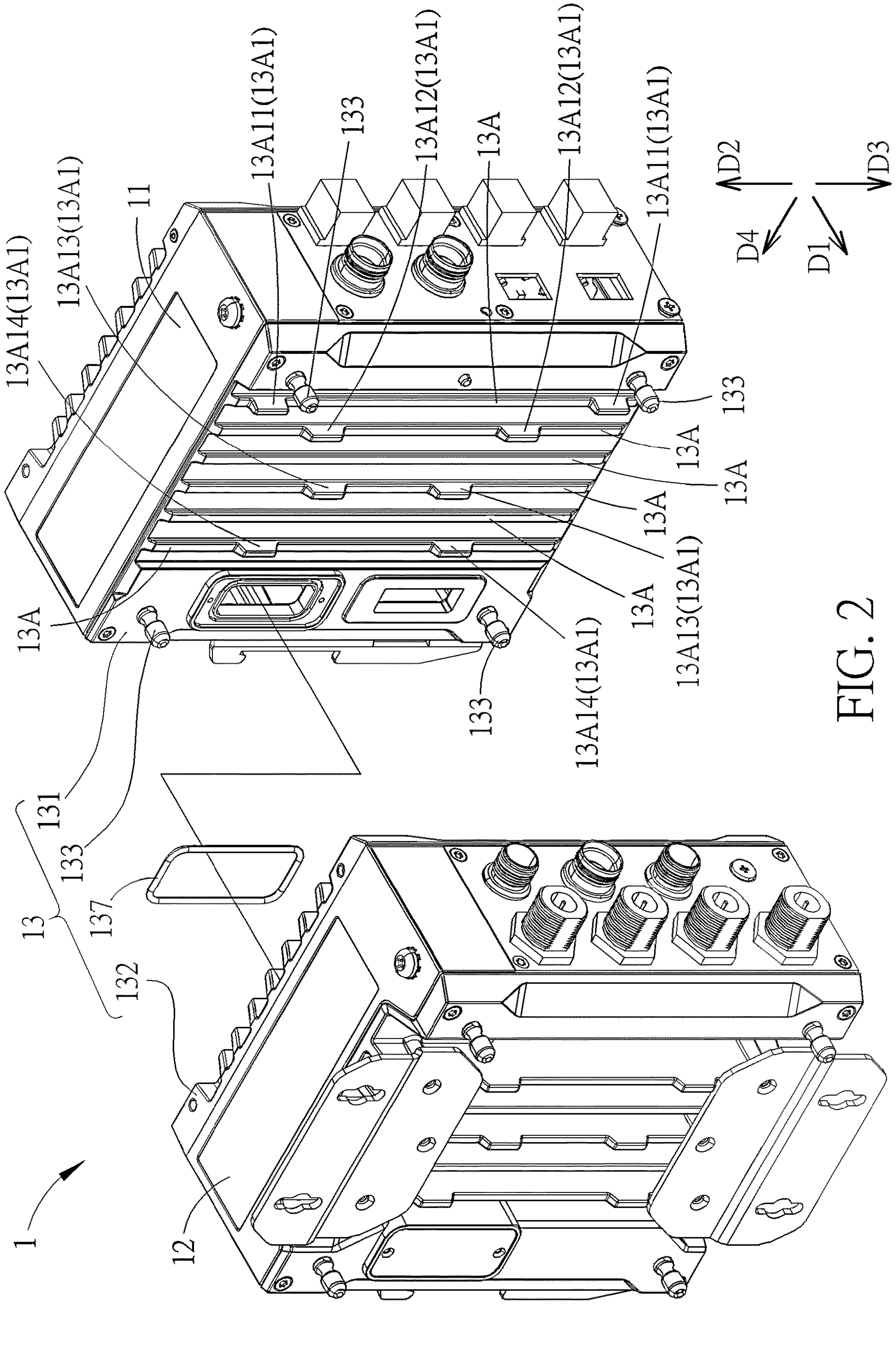
FIG. 2 and FIG. 3 are exploded diagrams of the electronic apparatus at different views according to the embodiment of the present invention.
Figure 3:
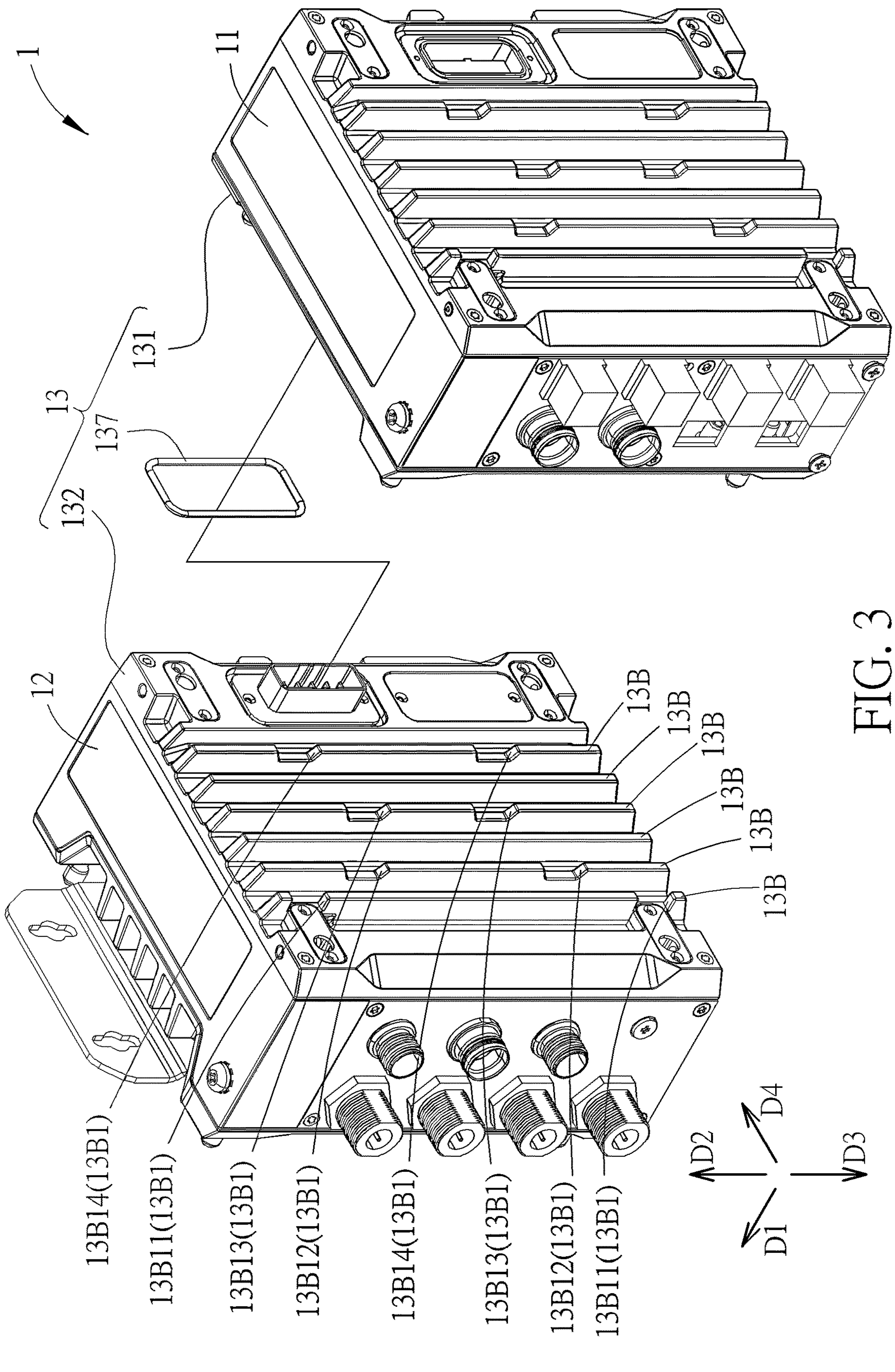
Figure 4:
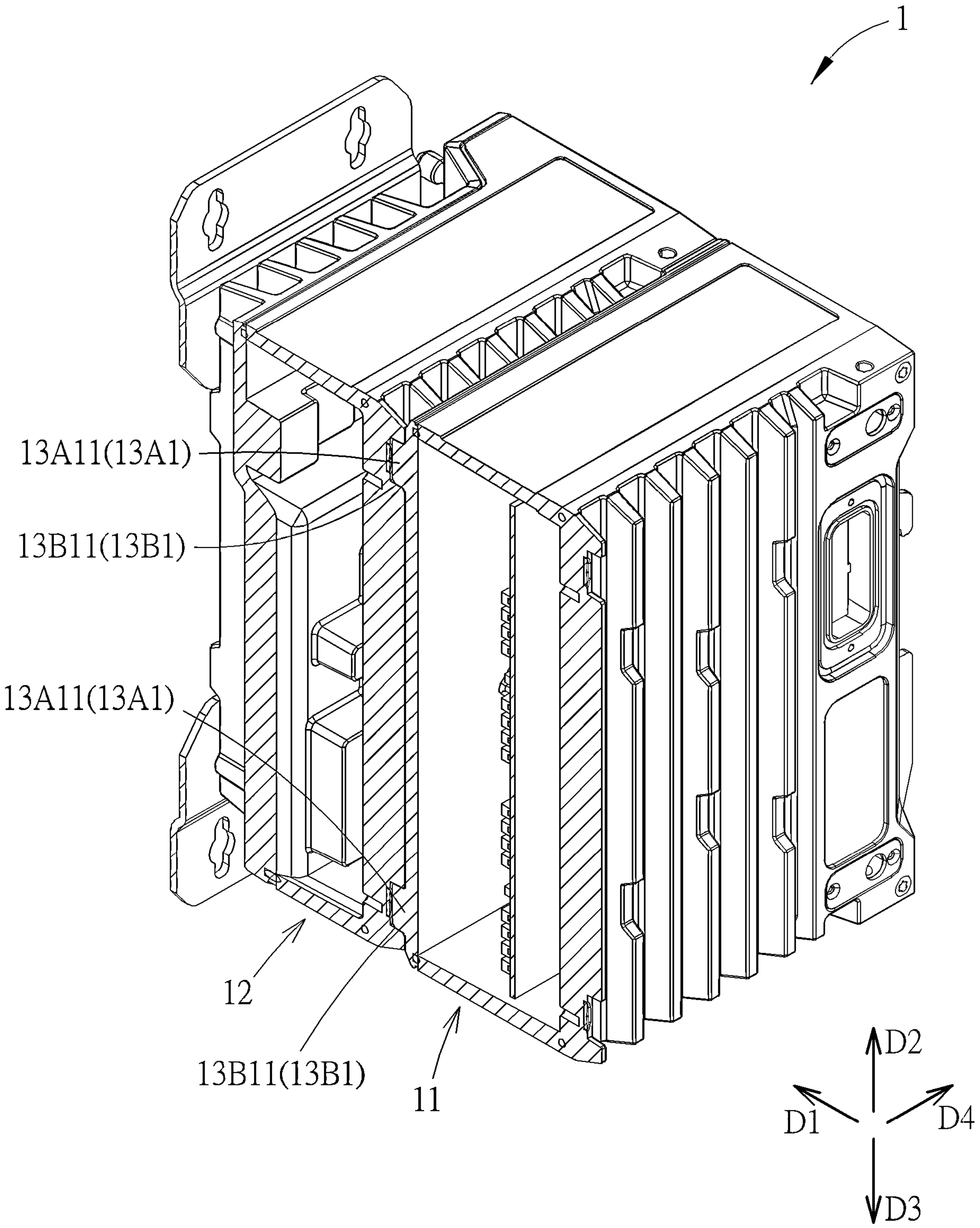
FIG. 4 to FIG. 7 are partial sectional diagrams of the electronic apparatus along different sectional lines according to the embodiment of the present invention.
Figure 5:
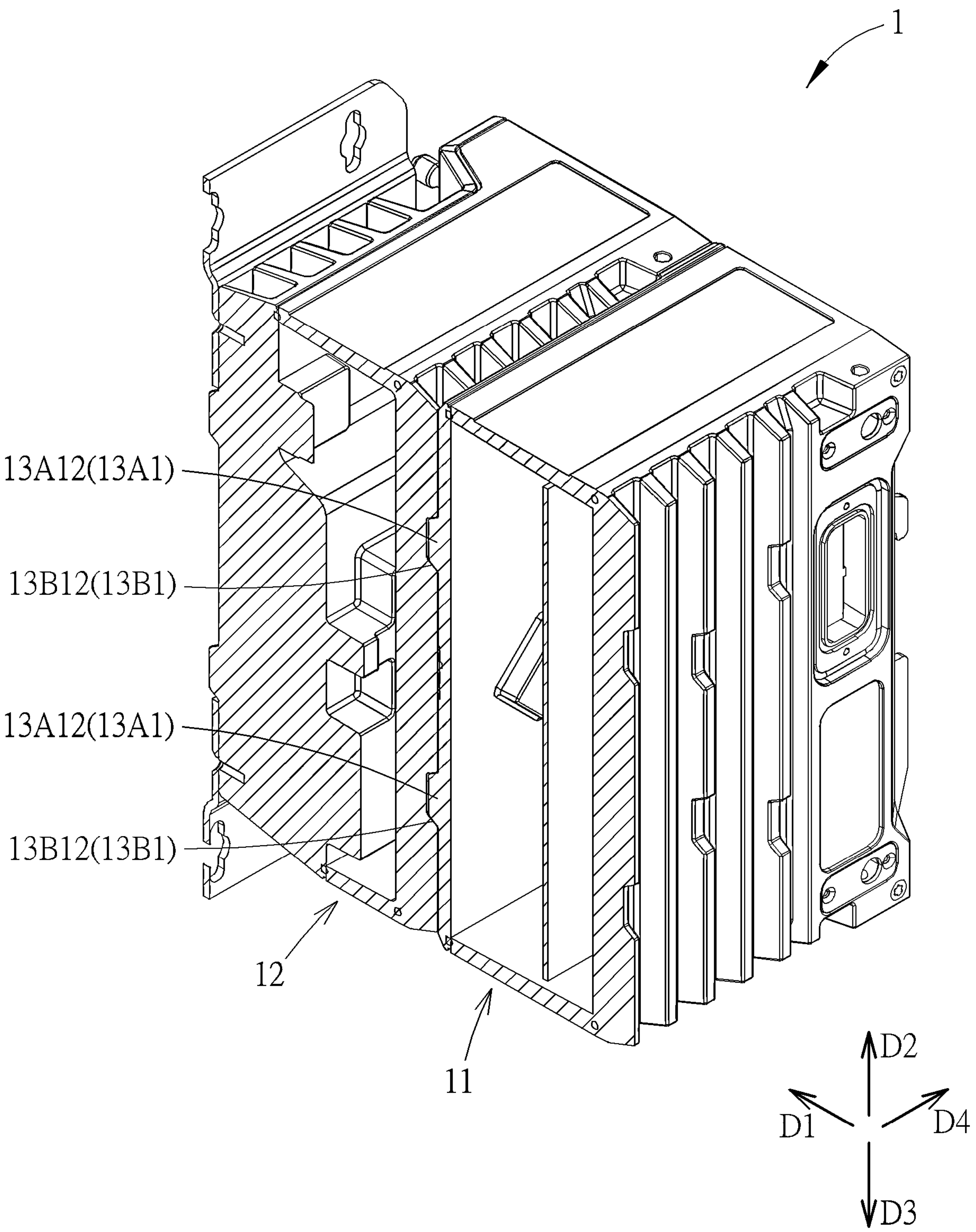
Figure 6:
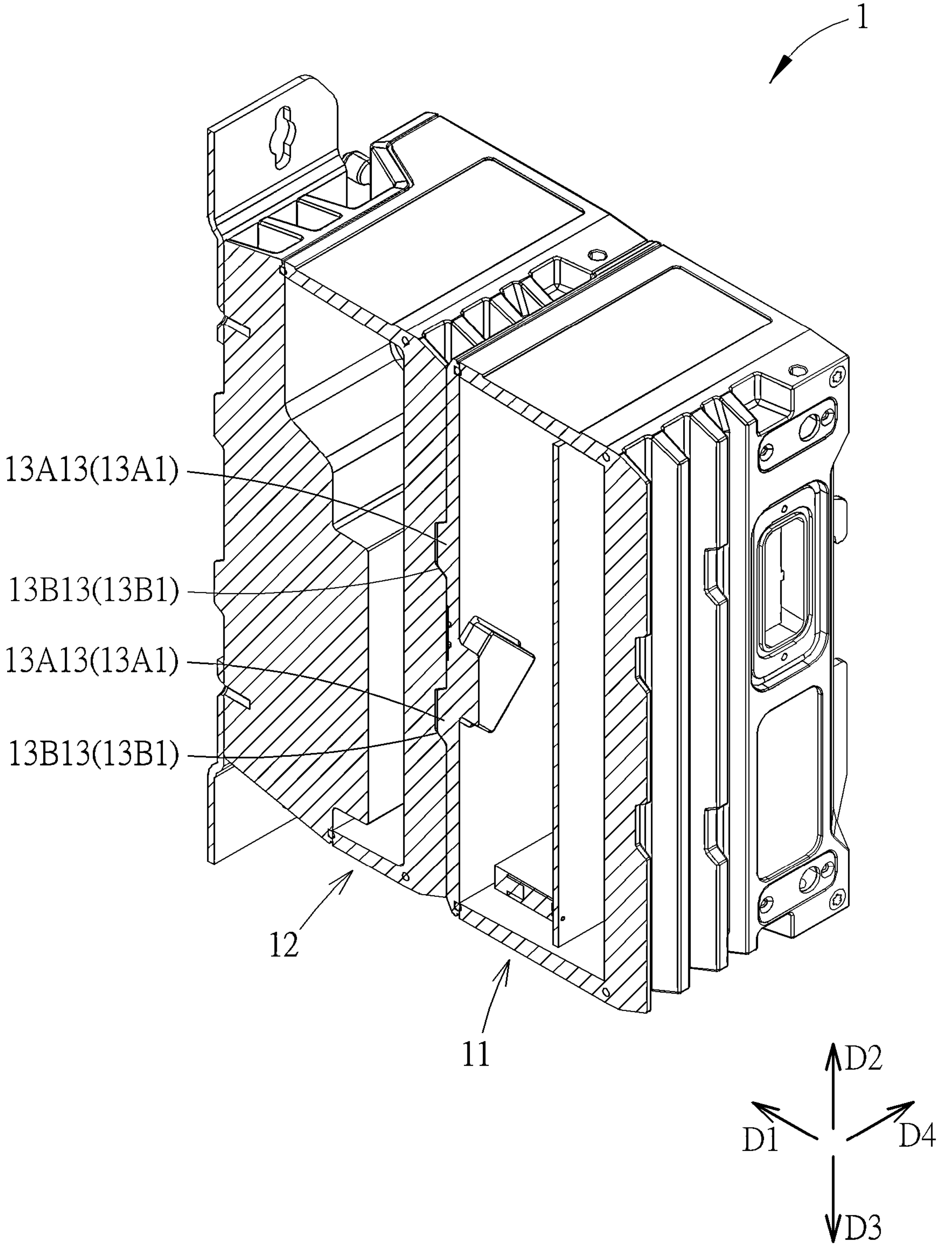
Figure 7:
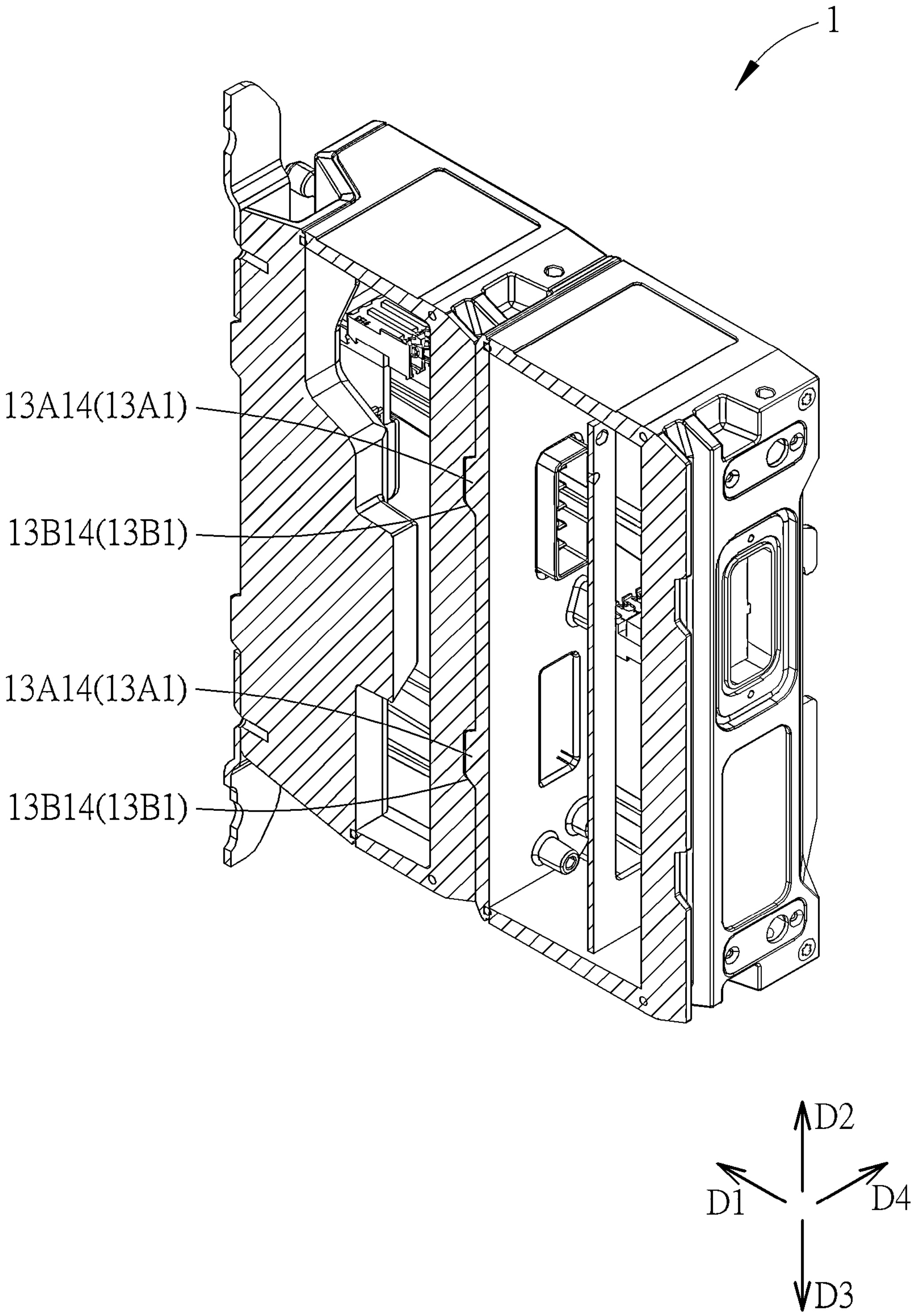

Please refer to FIG. 1 to FIG. 7. FIG. 1 is a schematic diagram of an electronic apparatus 1 according to an embodiment of the present invention. FIG. 2 and FIG. 3 are exploded diagrams of the electronic apparatus 1 at different views according to the embodiment of the present invention. FIG. 4 to FIG. 7 are partial sectional diagrams of the electronic apparatus 1 along different sectional lines according to the embodiment of the present invention. As shown in FIG. 1 to FIG. 7, the electronic apparatus 1 includes a first electronic device 11 and a second electronic device 12. The second electronic device 12 is detachably connected to the first electronic device 11. In this embodiment, the electronic apparatus 1 can be a remote terminal unit, and the first electronic device 11 and the second electronic device 12 can be a signal switch device and a radio frequency (RF) communication device, respectively. However, the present invention is not limited to this embodiment.

As shown in FIG. 2 to FIG. 7, the electronic apparatus 1 further includes a connecting assembly 13 configured to provide a tight and firm aligning connection between the first electronic device 11 and the second electronic device 12. The connecting assembly 13 includes a first connecting component 131, a second connecting component 132, four pins 133, six first heat dissipating fins 13A and six second heat dissipating fins 13B. The first connecting component 131 is disposed on the first electronic device 11. The second connecting component 132 is disposed on the second electronic device 12. Each of the pins 133 protrudes from the first connecting component 131 and is configured to be inserted into the second connecting component 132 along a first direction D1. Preferably, the four pins 133 are located on four corners of the first connecting component 131, respectively. The six first heat dissipating fins 13A are disposed on the first connecting component 131 and configured to dissipate heat generated by the first electronic device 11 rapidly. The six second heat dissipating fins 13B are disposed on the second connecting component 132 and configured to dissipate heat generated by the second electronic device 12 rapidly. Two engaging portions 13A1 are formed on each of four of the six first heat dissipating fins 13A. Two cooperating engaging portions 13B1 are formed on each of four of the six second heat dissipating fins 13B.

When each of the pins 133 is inserted into the second connecting component 132 along the first direction D1, the six first heat dissipating fins 13A are configured to be aligned with and abut against the six second heat dissipating fins 13B, respectively, and each of the engaging portions 13A1 is configured to engage with the corresponding cooperating engaging portion 13B1 along the first direction D1 and abut against the corresponding cooperating engaging portion 13B1 along a second direction D2 and a third direction D3 opposite to each other and perpendicular to the first direction D1. An abutting cooperation of each of the engaging portions 13A1 and the corresponding cooperating engaging portion 13B1 can provide support for the pin 133 along a vertical direction relative to the pin 133 for reducing a vertical shear force acting on the pin 133, so as to prevent the pin 133 from being damaged or broken. Besides, the abutting cooperation of each of the engaging portions 13A1 and the corresponding cooperating engaging portion 13B1 also can ensure the first electronic device 11 and the second electronic device 12 to be connected to each other and prevent the first electronic device 11 or the second electronic device 12 from being connected to another electronic device by mistake, so as to achieve a foolproof effect.

Understandably, the numbers of the pin, the first heat dissipating fin, the second heat dissipating fin, the engaging portion and the cooperating engaging portion are not limited to this embodiment. For example, in another embodiment, the connecting assembly can include one pin, two first heat dissipating fins and two second heat dissipating fins, and one engaging portion and one cooperating engaging portion are formed on one of the two first heat dissipating fins and one of the two second heat dissipating fins, respectively.

Furthermore, in this embodiment, as shown in FIG. 2 and FIG. 3, the first connecting component 131 can be integrally connected to a left cover of the first electronic device 11, and the second connecting component 132 can be integrally connected to a right cover of the second electronic device 12. However, the present invention is not limited to this embodiment. For example, in another embodiment, the first connecting component can be an independent member detachably connected to the left cover of the first electronic device, and the second connecting component can be an independent member detachably connected to the right cover of the second electronic device.

Besides, in this embodiment, as shown in FIG. 2 and FIG. 3, the first heat dissipating fins 13A can be integrally connected to the first connecting component 131, and the second heat dissipating fins 13B can be integrally connected to the second connecting component 132. However, the present invention is not limited to this embodiment. For example, in another embodiment, the first heat dissipating fins can be an independent member detachably connected to the first connecting component, and the second heat dissipating fins can be an independent member detachably connected to the second connecting component.

Preferably, in order to ensure smooth engagement of the engaging portion 13A1 and the cooperating engaging portion 13B1, as shown in FIG. 2 and FIG. 3, the engaging portion 13A1 and the cooperating engaging portion 13B1 can be an engaging protrusion and an engaging recess. A width of the engaging protrusion can gradually decrease from a bottom of the engaging protrusion, and a width of the engaging recess can gradually increase from a bottom of the engaging recess. For example, the engaging protrusion can be a trapezoid-shaped protrusion with a width gradually decreasing along the first direction D1, and the engaging recess can be a trapezoid-shaped recess with a width gradually decreasing along the first direction D1. Such configuration guides the engaging portion 13A1 and the cooperating engaging portion 13B1 to be aligned with each other by a sliding cooperation between corresponding inclined surfaces thereof during a process of that the first electronic device 11 and the second electronic device 12 move toward each other. However, the present invention is not limited to this embodiment. For example, in another embodiment, the engaging portion and the cooperating engaging portion can be an engaging recess and an engaging protrusion, and the engaging portion and the cooperating engaging portion have substantially uniform widths, i.e., the engaging portion and the cooperating engaging portion can be a rectangular recess and a rectangular protrusion, respectively.

In addition, in order to prevent stress concentration, as shown in FIG. 2, a first one, a second one, a third one, a fourth one, a fifth one and a sixth one of the six first heat dissipating fins 13A can be sequentially arranged along a fourth direction D4, and the engaging portions 13A1 on the first one, the second one, the fourth one and the sixth one of the six first heat dissipating fins 13A can be considered as two first engaging portions 13A11, two second engaging portions 13A12, two third engaging portions 13A13 and two fourth engaging portions 13A14, respectively. The second one of the six first heat dissipating fins 13A, whereon the second engaging portions 13A12 are formed, is located between the first one and the fourth one of the six first heat dissipating fins 13A, whereon the first engaging portions 13A11 and the third engaging portions 13A13 are respectively formed, along the fourth direction D4. Each of the second engaging portions 13A12 and the corresponding first engaging portion 13A11 are misaligned from each other along the fourth direction D4. Each of the second engaging portions 13A12 and the corresponding third engaging portion 13A13 are misaligned from each other along the fourth direction D4. The fourth one of the six first heat dissipating fins 13A, whereon the third engaging portions 13A13 are formed, is located between the second one and the sixth one of the six first heat dissipating fins 13A, whereon the second engaging portions 13A12 and the fourth engaging portions 13A14 are respectively formed, along the fourth direction D4. Each of the third engaging portions 13A13 and the corresponding second engaging portion 13A12 are misaligned from each other along the fourth direction D4. Each of the third engaging portions 13A13 and the corresponding fourth engaging portion 13A14 are misaligned from each other along the fourth direction D4.

Correspondingly, as shown in FIG. 3, a first one, a second one, a third one, a fourth one, a fifth one and a sixth one of the six second heat dissipating fins 13B can be sequentially arranged along the fourth direction D4, and the cooperating engaging portions 13B1 on the first one, the second one, the fourth one and the sixth one of the six second heat dissipating fins 13B can be considered as two first cooperating engaging portions 13B11, two second cooperating engaging portions 13B12, two third cooperating engaging portions 13B13 and two fourth cooperating engaging portions 13B14. The second one of the six second heat dissipating fins 13B, whereon the second cooperating engaging portions 13B12 are formed, is located between the first one and the fourth one of the six second heat dissipating fins 13B, whereon the first cooperating engaging portions 13B11 and the third cooperating engaging portions 13B13 are respectively formed, along the fourth direction D4. Each of the second cooperating engaging portions 13B12 and the corresponding first cooperating engaging portion 13B11 are misaligned from each other along the fourth direction D4. Each of the second cooperating engaging portions 13B12 and the corresponding third cooperating engaging portion 13B13 are misaligned from each other along the fourth direction D4. The fourth one of the six second heat dissipating fins 13B, whereon the third cooperating engaging portions 13B13 are formed, is located between the second one and the sixth one of the six second heat dissipating fins 13B, whereon the second cooperating engaging portions 13B12 and the fourth cooperating engaging portions 13B14 are respectively formed, along the fourth direction D4. Each of the third cooperating engaging portions 13B13 and the corresponding second cooperating engaging portion 13B12 are misaligned from each other along the fourth direction D4. Each of the third cooperating engaging portions 13B13 and the corresponding fourth cooperating engaging portion 13B14 are misaligned from each other along the fourth direction D4.

Figure 8:
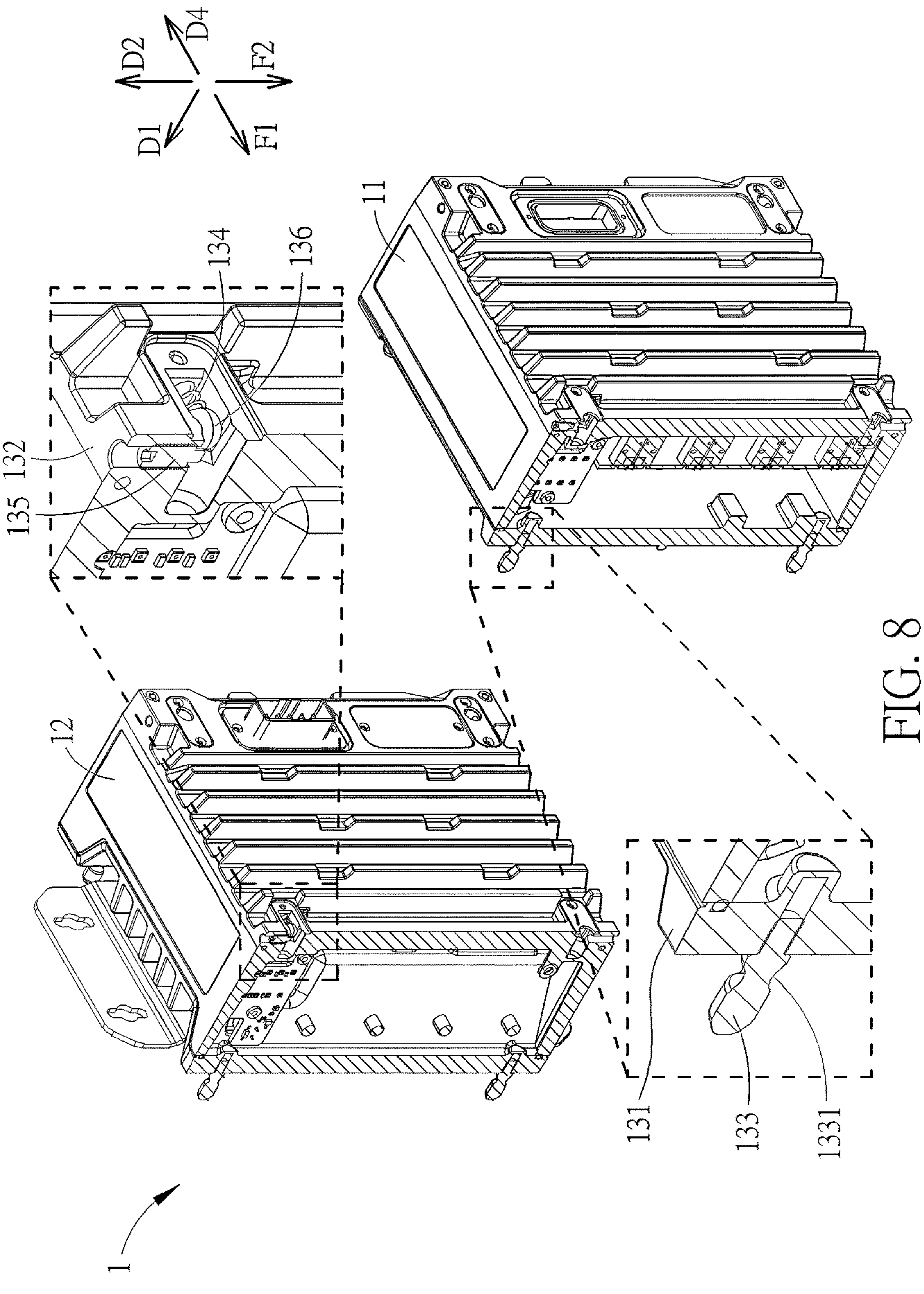
FIG. 8 is a partial sectional exploded diagram of the electronic apparatus according to the embodiment of the present invention.
Figure 9:
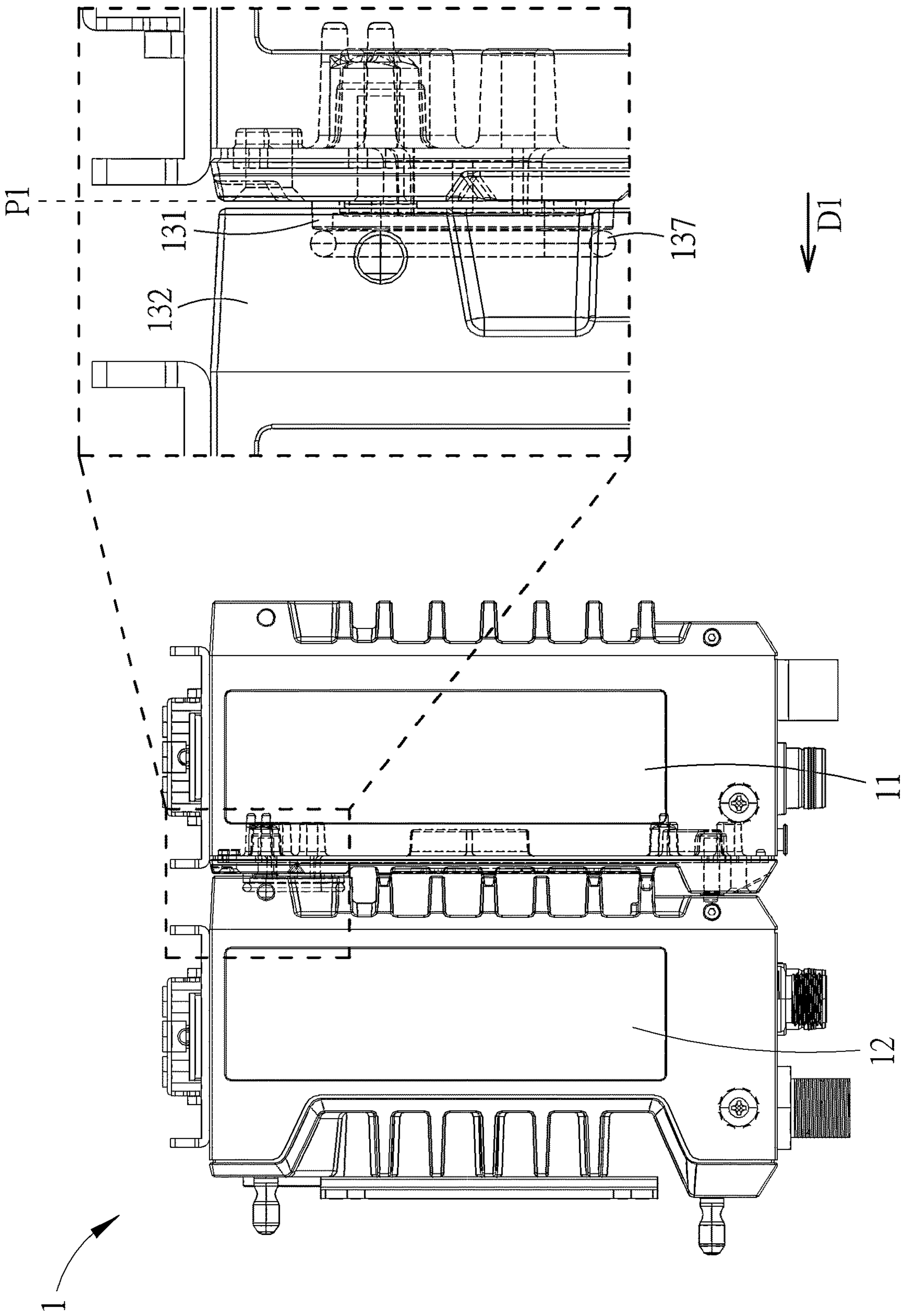
FIG. 9 is a partial structural diagram of the electronic apparatus in a non-locked state according to the embodiment of the present invention.
Figure 10:
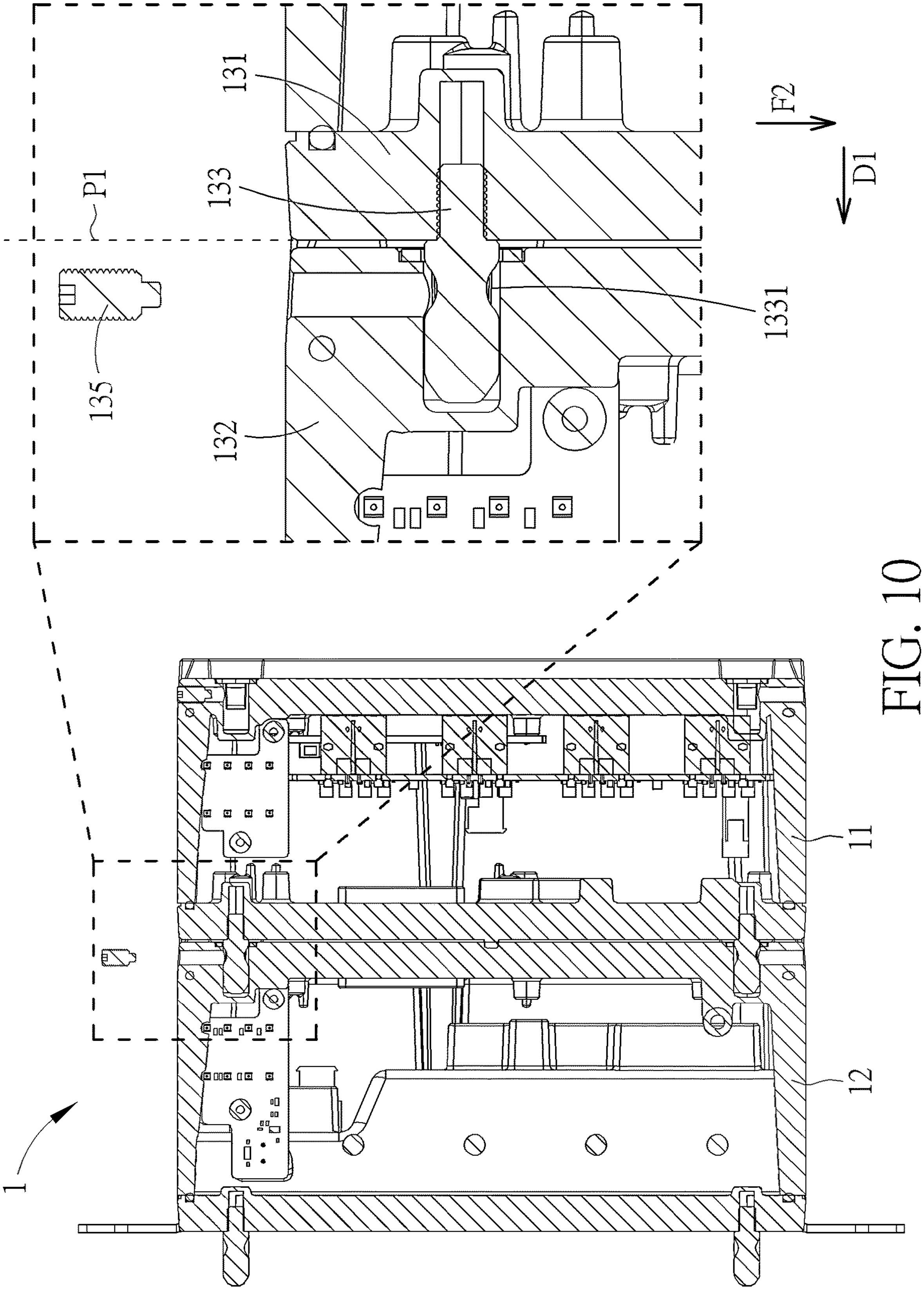
FIG. 10 and FIG. 11 are partial sectional diagrams of the electronic apparatus in the non-locked state along different sectional lines according to the embodiment of the present invention.
Figure 11:
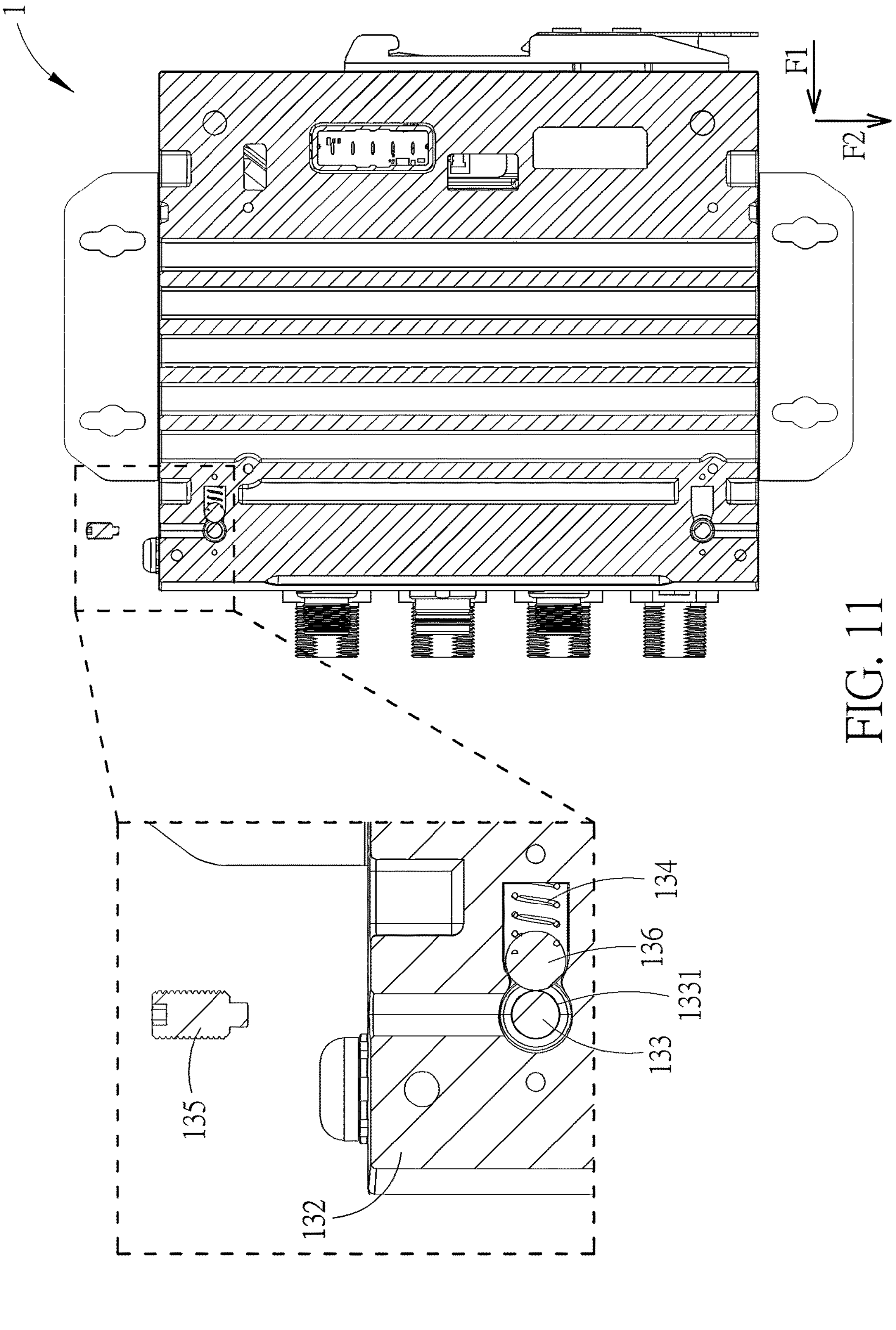
Figure 12:
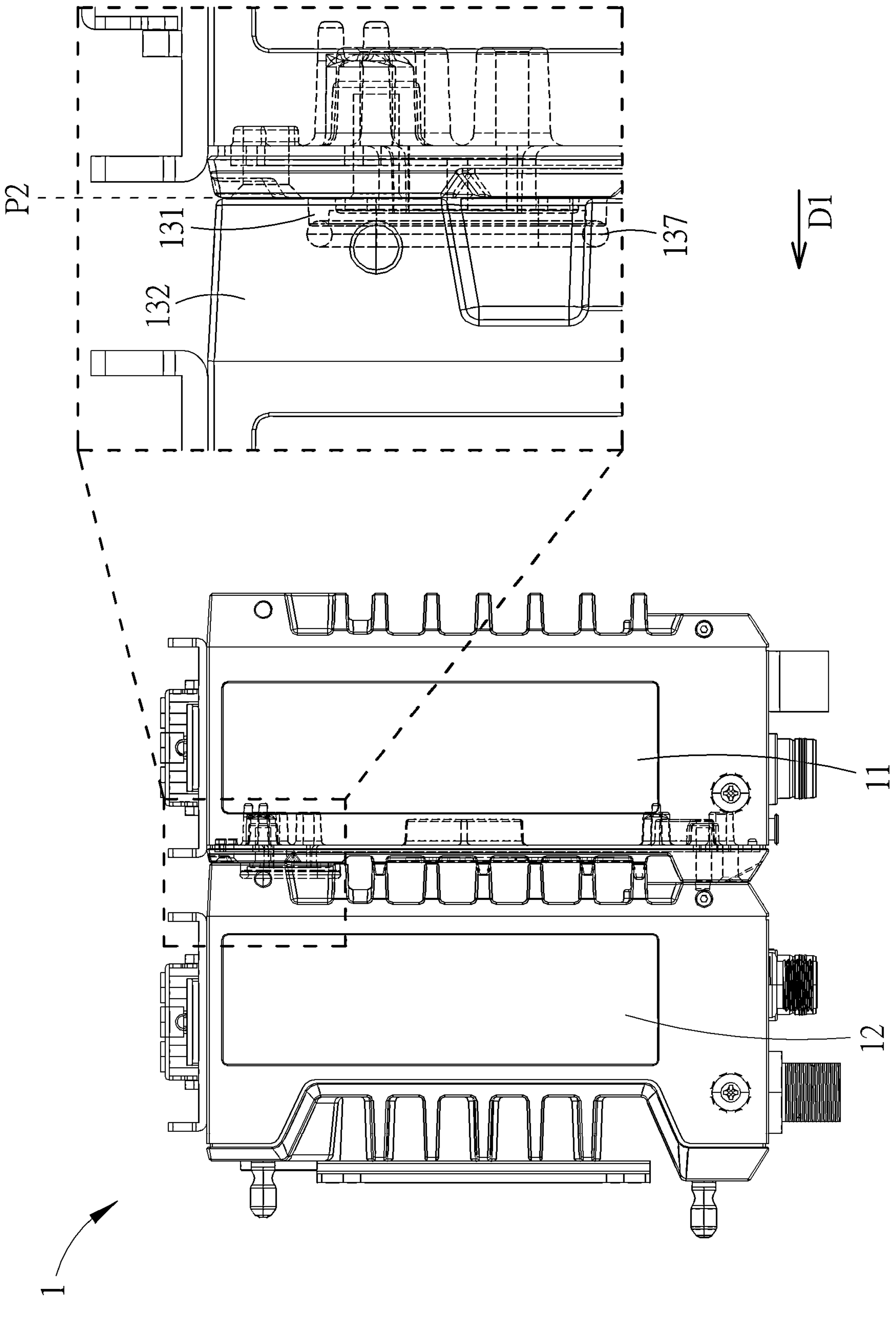
FIG. 12 is a partial structural diagram of the electronic apparatus in a locked state according to the embodiment of the present invention.
Figure 13:
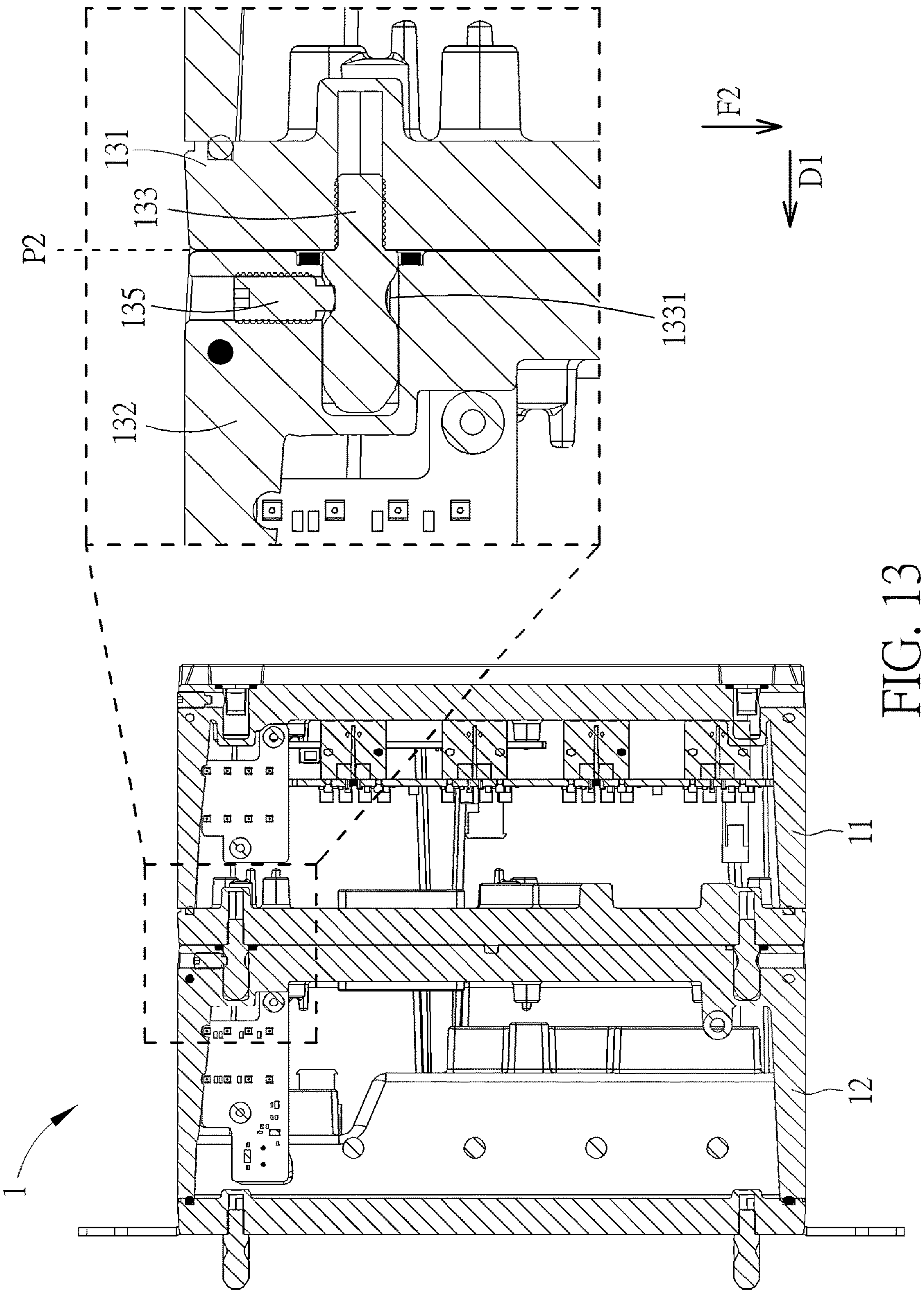
FIG. 13 and FIG. 14 are partial sectional diagrams of the electronic apparatus in the locked state along different sectional lines according to the embodiment of the present invention.
Figure 14:
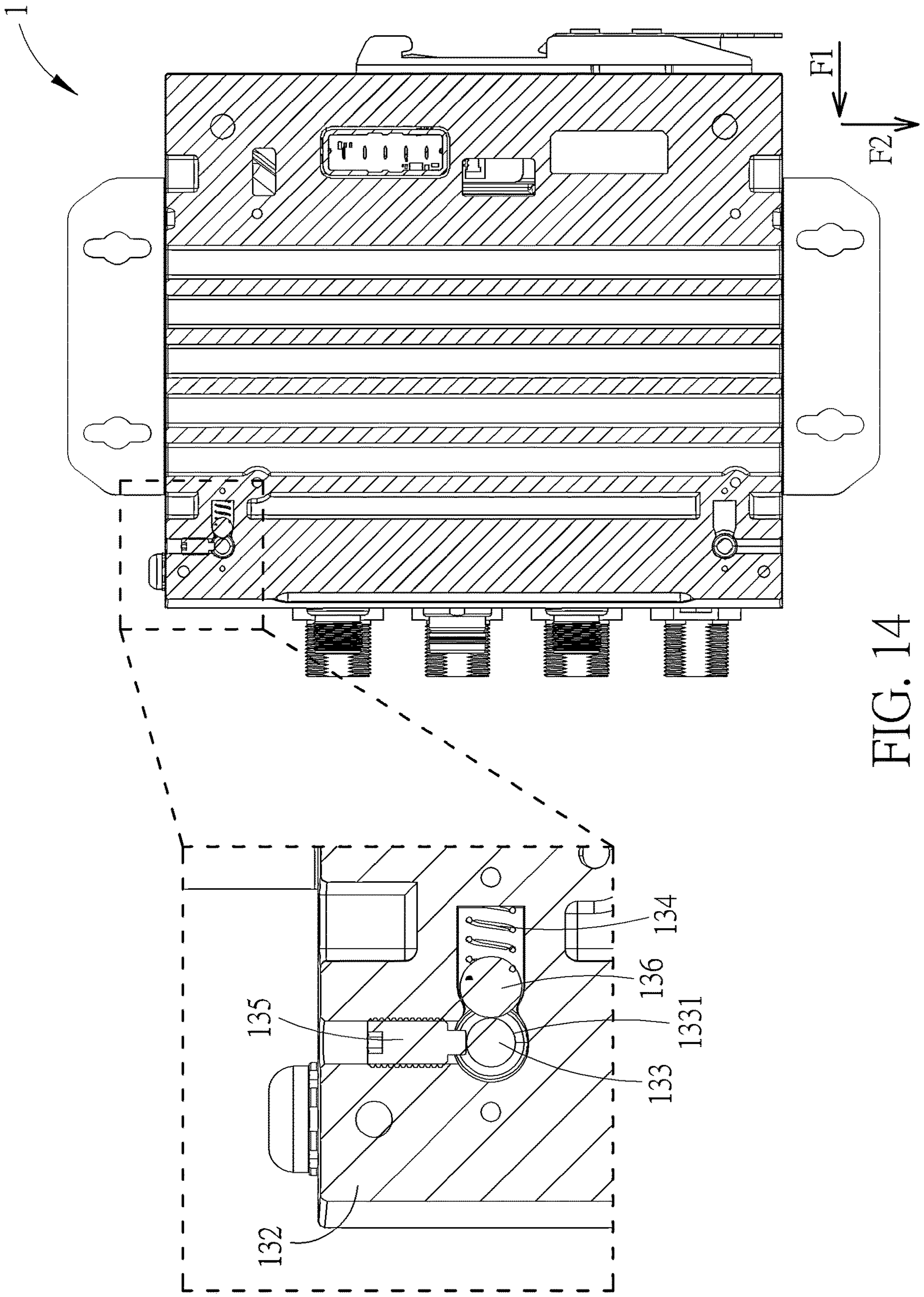

Please further refer to FIG. 2, FIG. 3 and FIG. 8 to FIG. 14. FIG. 8 is a partial sectional exploded diagram of the electronic apparatus 1 according to the embodiment of the present invention. FIG. 9 is a partial structural diagram of the electronic apparatus 1 in a non-locked state according to the embodiment of the present invention. FIG. 10 and FIG. 11 are partial sectional diagrams of the electronic apparatus 1 in the non-locked state along different sectional lines according to the embodiment of the present invention. FIG. 12 is a partial structural diagram of the electronic apparatus 1 in a locked state according to the embodiment of the present invention. FIG. 13 and FIG. 14 are partial sectional diagrams of the electronic apparatus 1 in the locked state along different sectional lines according to the embodiment of the present invention. As shown in FIG. 2, FIG. 3 and FIG. 8 to FIG. 14, in order to lock the four pins 133 inserted into the second connecting component 132, the connecting assembly 13 further includes four resilient components 134, four locking components 135 and four abutting components 136. Each of the resilient components 134 is disposed inside the second connecting component 132 and configured to apply a radial resilient force onto the corresponding pin 133 inserted into the second connecting component 132. Each of the locking components 135 is screwed onto the second connecting component 132 and configured to apply a radial locking force onto the corresponding pin 133 inserted into the second connecting component 132. Each of the abutting components 136 is disposed inside the second connecting component 132 and configured to abut against the corresponding pin 133. In other words, the resilient component 134 is configured to abut against the abutting component 136 to indirectly apply the radial resilient force onto the pin 133 via the abutting component 136. For example, as shown in FIG. 8, the resilient component 134 is configured to apply the radial resilient force onto the corresponding pin 133 inserted into the second connecting component 132 along a first forcing direction F1, and the locking components 135 is configured to apply the radial locking force onto the corresponding pin 133 inserted into the second connecting component 132 along a second forcing direction F2, wherein the first forcing direction F1 and the second forcing direction F2 can be substantially perpendicular to each other and substantially perpendicular to the first direction D1, and first forcing direction F1 and the second forcing direction F2 can be substantially opposite to the fourth direction D4 and the second direction D2, respectively.

In this embodiment, the locking component 135 can be a screw or a bolt, and the resilient component 134 can be a compression spring. Furthermore, in this embodiment, the abutting component 136 can be a ball-shaped structure made of metal material. However, the present invention is not limited to this embodiment. For example, in another embodiment, the abutting component can be a protruding platform made of plastic material or resilient material.

Understandably, the numbers of the pin, the resilient component and the locking component are not limited to this embodiment. For example, in another embodiment, the connecting assembly can include one pin, one resilient component and one locking component.

Understandably, the locking configuration for locking the pin is not limited to this embodiment. For example, in another embodiment, the abutting component can be omitted, and the resilient component can be a U-shaped spring configured to directly abut against two opposite sides of the pin to directly apply two radial resilient forces onto the pin along two opposite directions.

Specifically, as shown in FIG. 2, FIG. 3 and FIG. 8 to FIG. 14, a groove 1331 is formed on an outer periphery of each of the pins 133 along a circumferential direction of the corresponding pin 133 and configured to cooperate with the corresponding abutting component 136 and the corresponding locking component 135. Each of the grooves 1331 is abutted by the corresponding abutting component 136 along the first forcing direction F1 and the corresponding locking component 135 along the second forcing direction F2, so as to lock the corresponding pin 133 with the radial resilient force generated by the corresponding resilient component 134 along the first forcing direction F1 and the radial locking force generated by the corresponding locking component 135 along the second forcing direction F2 perpendicular to the first forcing direction F1.

Understandably, in another embodiment, there can be two different grooves formed on the pin and configured to be abutted by the abutting component and the locking component, respectively, and the resilient component and the locking component can be configured to apply the radial resilient force and the radial locking force onto the pin along two opposite directions, respectively.

Moreover, as shown in FIG. 2, FIG. 3 and FIG. 8 to FIG. 14, the connecting assembly 13 further includes a sealing component 137 disposed between the first connecting component 131 and the second connecting component 132. The sealing component 137 can be made of resilient material. The sealing component 137 can position the pin 133 at an initial inserting position as shown in FIG. 9 and FIG. 10 when the pin 133 is inserted to the second connecting component 132. Afterwards, when the locking component 135 is screwed onto the second connecting component 132, a cooperation of the locking component 135 and the groove 1331 can drive the pin 133 to move from the initial inserting position P1 as shown in FIG. 9 and FIG. 10 to a predetermined inserting position P2 as shown in FIG. 12 and FIG. 13 along the first direction D1, so as to drive the first connecting component 131 to move along the first direction D1 together with the pin 133, such that the sealing component 137 is clamped to be resiliently deformed by the first connecting component 131 and the second connecting component 132. The aforementioned configuration achieves seamless connection of the first connecting component 131 and the second connecting component 132 to meet requirements of dustproof and waterproof functions for preventing moisture or particle from entering into the first electronic device 11 and/or the second electronic device 12.

In this embodiment, the sealing component 137 can be an O-shaped sealing ring surrounding an electrical connector of the first electronic device 11 and an electrical connector of the second electronic device 12. However, the present invention is not limited to this embodiment.

Understandably, in another embodiment, if there is no demand for dustproof and waterproof functions, the sealing component can be omitted. Furthermore, the pin can be configured to be located at the predetermined inserting position when being inserted into the second connecting component, and the locking component can be configured to lock the pin located at the predetermined inserting position after insertion of the pin into the second connecting component.

In contrast to the prior art, in the present invention, a cooperation of the engaging portion and the cooperating engaging portion can provide support for the pin along a vertical direction relative to the pin for reducing a vertical shear force acting on the pin, so as to prevent the pin from being damaged or broken. Besides, the cooperation of the engaging portion and the cooperating engaging portion also can ensure the first electronic device and the second electronic device to be connected to each other and prevent the first electronic device or the second electronic device from being connected to another electronic device by mistake, so as to achieve a foolproof effect. From the above, the present invention has improved reliability in use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A connecting assembly for providing an aligning connection between a first electronic device and a second electronic device, the connecting assembly comprising:

a first connecting component disposed on the first electronic device;

a plurality of first heat dissipating fins disposed on the first connecting component, an engaging portion being formed on at least one of the plurality of first heat dissipating fins;

a second connecting component disposed on the second electronic device;

a plurality of second heat dissipating fins disposed on the second connecting component, a cooperating engaging portion being formed on at least one of the plurality of second heat dissipating fins; and a pin protruding from the first connecting component and configured to be inserted into the second connecting component along a first direction, when the pin is inserted into the second connecting component along the first direction, the plurality of first heat dissipating fins being configured to respectively be aligned with and abut against the plurality of second heat dissipating fins along the first direction, and the engaging portion being configured to engage with the cooperating engaging portion along the first direction and abut against the cooperating engaging portion along a second direction and a third direction opposite to each other and perpendicular to the first direction.

2. The connecting assembly of claim 1, wherein one and another one of the engaging portion and the cooperating engaging portion are an engaging protrusion and an engaging recess.

3. The connecting assembly of claim 2, wherein a width of the engaging protrusion gradually decreases from a bottom of the engaging protrusion, and a width of the engaging recess gradually increases from a bottom of the engaging recess.

4. The connecting assembly of claim 1, wherein a first engaging portion, a second engaging portion and a third engaging portion are respectively formed on a first one, a second one and a third one of the plurality of first heat dissipating fins, the second one of the plurality of first heat dissipating fins is located between the first one and the third one of the plurality of first heat dissipating fins along an arranging direction of the plurality of first heat dissipating fins, the second engaging portion and the first engaging portion are misaligned from each other along the arranging direction of the plurality of first heat dissipating fins, the second engaging portion and the third engaging portion are misaligned from each other along the arranging direction of the plurality of first heat dissipating fins, a first cooperating engaging portion, a second cooperating engaging portion and a third cooperating engaging portion are respectively formed on a first one, a second one and a third one of the plurality of second heat dissipating fins, the second one of the plurality of second heat dissipating fins is located between the first one and the third one of the plurality of second heat dissipating fins along an arranging direction of the plurality of second heat dissipating fins, the second engaging portion and the first engaging portion are misaligned from each other along the arranging direction of the plurality of second heat dissipating fins, and the second engaging portion and the third engaging portion are misaligned from each other along the arranging direction of the plurality of second heat dissipating fins.

5. The connecting assembly of claim 1, further comprising:

a resilient component disposed inside the second connecting component and configured to apply a radial resilient force onto the pin inserted into the second connecting component; and a locking component screwed onto the second connecting component and configured to apply a radial locking force onto the pin inserted into the second connecting component.

6. The connecting assembly of claim 5, further comprising an abutting component disposed inside the second connecting component and configured to abut against the pin, and the resilient component abutting against the abutting component to indirectly apply the radial resilient force onto the pin via the abutting component.

7. The connecting assembly of claim 6, wherein a groove is formed on an outer periphery of the pin along a circumferential direction of the pin and configured to cooperate with the abutting component and the locking component.

8. The connecting assembly of claim 7, further comprising a sealing component disposed between the first connecting component and the second connecting component, and when the locking component is screwed onto the second connecting component, a cooperation of the locking component and the groove driving the pin to move from an initial inserting position to a predetermined inserting position along the first direction for driving the first connecting component to move along the first direction together with the pin, such that the sealing component is clamped to be resiliently deformed by the first connecting component and the second connecting component.

9. The connecting assembly of claim 6, wherein the abutting component is a ball-shaped structure or a protruding platform structure, the locking component is a screw or a bolt, and the resilient component is a compression spring.

10. The connecting assembly of claim 1, further comprising a sealing component disposed between the first connecting component and the second connecting component, and when the locking component is screwed onto the second connecting component, a cooperation of the locking component and the pin driving the pin to move from an initial inserting position to a predetermined inserting position along the first direction for driving the first connecting component to move along the first direction together with the pin, such that the sealing component is clamped to be resiliently deformed by the first connecting component and the second connecting component.

11. An electronic apparatus comprising:
- a first electronic device;
- a second electronic device detachably connected to the first electronic device; and
- a connecting assembly for providing an aligning connection between the first electronic device and the second electronic device, the connecting assembly comprising:
  - a first connecting component disposed on the first electronic device;
  - a plurality of first heat dissipating fins disposed on the first connecting component, an engaging portion being formed on at least one of the plurality of first heat dissipating fins;
  - a second connecting component disposed on the second electronic device;
  - a plurality of second heat dissipating fins disposed on the second connecting component, a cooperating engaging portion being formed on at least one of the plurality of second heat dissipating fins; and
  - a pin protruding from the first connecting component and configured to be inserted into the second connecting component along a first direction, when the pin is inserted into the second connecting component along the first direction, the plurality of first heat dissipating fins being configured to respectively be aligned with and abut against the plurality of second heat dissipating fins along the first direction, and the engaging portion being configured to engage with the cooperating engaging portion along the first direction and abut against the cooperating engaging portion along a second direction and a third direction opposite to each other and perpendicular to the first direction.

12. The electronic apparatus of claim 11, wherein one and another one of the engaging portion and the cooperating engaging portion are an engaging protrusion and an engaging recess.

13. The electronic apparatus of claim 12, wherein a width of the engaging protrusion gradually decreases from a bottom of the engaging protrusion, and a width of the engaging recess gradually increases from a bottom of the engaging recess.

14. The electronic apparatus of claim 11, wherein a first engaging portion, a second engaging portion and a third engaging portion are respectively formed on a first one, a second one and a third one of the plurality of first heat dissipating fins, the second one of the plurality of first heat dissipating fins is located between the first one and the third one of the plurality of first heat dissipating fins along an arranging direction of the plurality of first heat dissipating fins, the second engaging portion and the first engaging portion are misaligned from each other along the arranging direction of the plurality of first heat dissipating fins, the second engaging portion and the third engaging portion are misaligned from each other along the arranging direction of the plurality of first heat dissipating fins, a first cooperating engaging portion, a second cooperating engaging portion and a third cooperating engaging portion are respectively formed on a first one, a second one and a third one of the plurality of second heat dissipating fins, the second one of the plurality of second heat dissipating fins is located between the first one and the third one of the plurality of second heat dissipating fins along an arranging direction of the plurality of second heat dissipating fins, the second engaging portion and the first engaging portion are misaligned from each other along the arranging direction of the plurality of second heat dissipating fins, and the second engaging portion and the third engaging portion are misaligned from each other along the arranging direction of the plurality of second heat dissipating fins.

15. The electronic apparatus of claim 11, wherein the connecting assembly further comprises:
- a resilient component disposed inside the second connecting component and configured to apply a radial resilient force onto the pin inserted into the second connecting component; and
- a locking component screwed onto the second connecting component and configured to apply a radial locking force onto the pin inserted into the second connecting component.

16. The electronic apparatus of claim 15, wherein the connecting assembly further comprises an abutting component disposed inside the second connecting component and configured to abut against the pin, and the resilient component abuts against the abutting component to indirectly apply the radial resilient force onto the pin via the abutting component.

17. The electronic apparatus of claim 16, wherein a groove is formed on an outer periphery of the pin along a circumferential direction of the pin and configured to cooperate with the abutting component and the locking component.

18. The electronic apparatus of claim 17, wherein the connecting assembly further comprises a sealing component disposed between the first connecting component and the second connecting component, and when the locking component is screwed onto the second connecting component, a cooperation of the locking component and the groove drives the pin to move from an initial inserting position to a predetermined inserting position along the first direction for driving the first connecting component to move along the first direction together with the pin, such that the sealing component is clamped to be resiliently deformed by the first connecting component and the second connecting component.

19. The electronic apparatus of claim 16, wherein the abutting component is a ball-shaped structure or a protruding platform structure, the locking component is a screw or a bolt, and the resilient component is a compression spring.

20. The electronic apparatus of claim 11, wherein the connecting assembly further comprises a sealing component disposed between the first connecting component and the second connecting component, and when the locking component is screwed onto the second connecting component, a cooperation of the locking component and the pin drives the pin to move from an initial inserting position to a predetermined inserting position along the first direction for driving the first connecting component to move along the first direction together with the pin, such that the sealing component is clamped to be resiliently deformed by the first connecting component and the second connecting component.

* * * * *